United States Patent [19]

Ozmat

[11] Patent Number: 5,402,004
[45] Date of Patent: Mar. 28, 1995

[54] HEAT TRANSFER MODULE FOR ULTRA HIGH DENSITY AND SILICON ON SILICON PACKAGING APPLICATIONS

[75] Inventor: Burhan Ozmat, Dallas, Tex.

[73] Assignee: Texas Instruments Incorporated, Dallas, Tex.

[21] Appl. No.: 17,454

[22] Filed: Feb. 12, 1993

Related U.S. Application Data

[63] Continuation of Ser. No. 567,473, Aug. 14, 1990, abandoned.

[51] Int. Cl.$^6$ ............................................. H01L 23/02
[52] U.S. Cl. ..................................... 257/717; 257/718; 257/720
[58] Field of Search ............... 357/82, 81; 165/80.3, 165/80.4, 104.33; 361/385; 257/717, 718, 720, 796

[56] References Cited

U.S. PATENT DOCUMENTS

| | | | |
|---|---|---|---|
| 4,482,912 | 11/1984 | Chiba et al. | 357/81 |
| 4,541,004 | 9/1985 | Moore | 357/81 |
| 4,652,970 | 3/1987 | Watari et al. | 357/82 |
| 4,730,665 | 3/1988 | Cutchaw | 357/82 |
| 4,823,863 | 4/1989 | Nakajima et al. | 357/82 |
| 4,884,169 | 11/1989 | Cutchaw | 357/82 |

FOREIGN PATENT DOCUMENTS

| | | | |
|---|---|---|---|
| 57-103337 | 6/1982 | Japan | 357/82 |
| 6364347 | 3/1983 | Japan | 357/82 |
| 58-70561 | 4/1983 | Japan | 357/81 |
| 59-86563 | 5/1984 | Japan | 357/82 |
| 59-98541 | 6/1984 | Japan | 357/82 |
| 61-67972 | 4/1986 | Japan | 357/81 |
| 61-76356 | 4/1986 | Japan | 357/81 |
| 62-45051 | 2/1987 | Japan | 357/82 |
| 63-100759 | 5/1988 | Japan | 357/82 |
| 63-228652 | 9/1988 | Japan | 357/81 |

OTHER PUBLICATIONS

Thermally conductive elastomer for cooling. IBM technical disclosure bulletin vol. 28 No. 4 Sep. 1985.

*Primary Examiner*—William L. Sikes
*Assistant Examiner*—Hung Xuan Dang
*Attorney, Agent, or Firm*—René E. Grossman; Richard L. Donaldson

[57] ABSTRACT

A system for dissipating heat from semiconductor chips disposed on a substrate which may individually produce differing amounts of heat, the substrate secured to a device uniformly distributing the heat produced by the chips thereover in the form of a metal matrix composite of a thermally conductive material, preferably aluminum or copper, having layers of uniformly spaced fibers, preferably carbon, with a higher thermal conductivity than the metal of the metal matrix and embedded therein. Each layer has a plurality of such fibers in rows, each layer being orthogonal to the layers thereabove and therebelow. Preferably, none of the carbon fibers touch each other. The metal matrix is secured to a heat dissipating structure in the form of a housing having a sponge secured therein. The sponge is preferably of aluminum or copper and has a cellular structure, the cells having interconnecting porosity. The housing contains a fluid inlet and outlet whereby fluid travels through the sponge and withdraws heat from the walls of the sponge cells. In an alternative embodiment, the housing is secured to the metal matrix by means of an aluminum-silicon alloy braze layer which is brazed therebetween. Also, the metal matrix can be coated with a layer of pure aluminum to avoid or minimize corrosion. The sponge can be spaced from the housing walls containing the inlet and outlet to permit inlet fluid to travel through the sponge relatively uniformly throughout its entire volume rather than mainly in the direct path between inlet and outlet.

10 Claims, 3 Drawing Sheets

HEAT TRANSFER MODULE FOR ULTRA HIGH DENSITY AND SILICON ON SILICON PACKAGING APPLICATIONS

This application is a continuation, of application Ser. No. 07/567,473, filed Aug. 14, 1990, now abandoned.

BACKGROUND OF THE INVENTION

1. Field of the Invention

This invention relates to a heat transfer technology for use in conjunction with high packaging density semiconductor devices to rapidly remove heat from the semiconductor devices.

2. Brief Description of the Prior Art

As semiconductor devices continue to be made more compact with increased numbers of active components in a specified volume of semiconductor material, the amount of heat generated by the semiconductor devices also increases. The matter of heat removal and transfer therefore continues to be an ever increasing problem which must be resolved.

The prior art has utilized many approaches to the removal of heat, such as placing the devices into coolants and the like. This approach is not available in conjunction with modular units, for example, wherein portions of the device are often removed.

Conduction has also been used as a means of heat removal. However such systems have tended to be bulky and heavy and cannot be used when size and weight are a concern.

SUMMARY OF THE INVENTION

It is known that certain portions of semiconductor devices may generate more heat than do other portions thereof and that some semiconductor devices in a multidevice structure may produce more heat than other devices of the multidevice structure. Accordingly, one procedure that can be used to prevent overheating of a portion of or of a particular device can involve heat distribution whereby the heat from those devices or portions of devices producing the greatest amounts of heat is distributed elsewhere to devices or portions of devices which produce less heat to even out or make the heating in the devices as uniform as possible. This procedure is used in conjunction with heat transfer whereby heat is also dissipated by removal thereof from the devices themselves.

Briefly, in accordance with the present invention, semiconductor chips which may produce differing amounts of heat are disposed on a high thermal conductivity, coefficient of thermal expansion matched material substrate, such as ceramic, glass ceramic, metal matrix composite such as copper-graphite and aluminum-graphite and preferably a substrate of monocrystalline silicon, the substrate being secured to a device for uniformly distributing the heat produced by the chips over the substrate in the form of a metal matrix composite which is formed of a thermally conductive material, preferably aluminum or copper which has layers of uniformly spaced fibers, preferably carbon fibers, having a higher thermal conductivity than the metal of the metal matrix and embedded therein, each layer having a plurality of such fibers in rows, each layer being orthogonal to the layers thereabove and therebelow. The carbon fibers of each row and of adjacent rows preferably do not touch each other. The metal matrix is secured to a heat dissipating structure in the form of a housing having a high thermal conductivity metal ceramic sponge secured therein. The sponge is preferably formed of aluminum or copper and has a cellular structure, the cells displaying interconnecting porosity. The housing contains a fluid inlet and a fluid outlet whereby fluid travels through the sponge and withdraws heat from the walls of the sponge cells. In an alternative embodiment, the housing is secured to the metal matrix by means of an aluminum-silicon alloy braze layer which is brazed therebetween. Also, the metal matrix can be coated with a layer of pure aluminum to avoid or minimize corrosion. The sponge can be spaced from the housing walls containing the inlet and outlet to permit inlet fluid to travel through the sponge relatively uniformly throughout its entire volume rather than mainly in the direct path between inlet and outlet.

DESCRIPTION OF THE PREFERRED EMBODIMENTS

Figure 1:
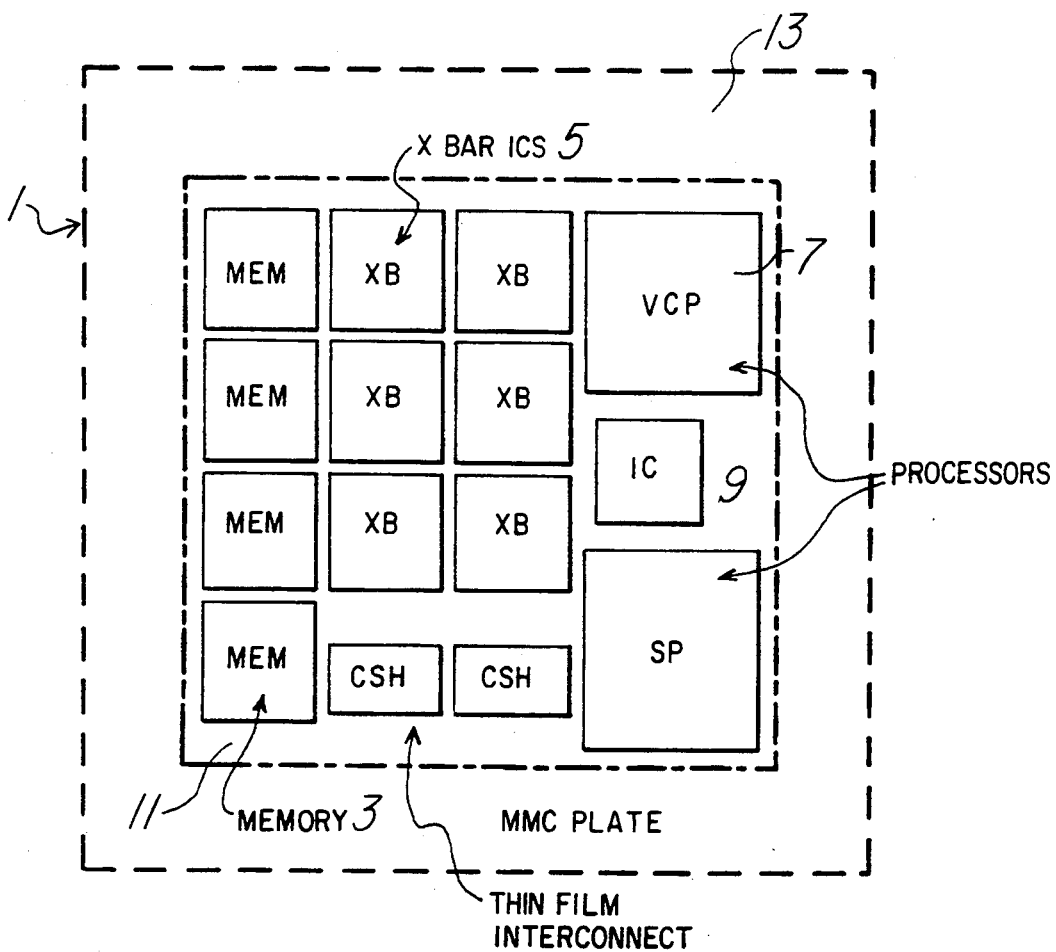
FIG. 1 is a top view of an electronic circuit with metal matrix in accordance with the present invention.

Referring first to FIG. 1, there is shown a typical electronic circuit 1 having, for example, a plurality of memory chips 3 which have a high power requirement and dissipate a large amount of heat (e.g., 10 watts per square inch), a distributing unit 5 which may have a relatively low power requirement and dissipates a relatively small amount of heat (e.g., 1 to 2 watts per square inch), a CPU chip 7 which has a high power requirement and dissipates a relative large amount of heat (e.g., 20 watts per square inch) and a further chip 9 which may have a moderate power requirement and dissipate a moderate amount of heat (about 5 watts per square inch). The chips are disposed on a substrate 11 which can be formed of, for example, monocrystalline silicon and which has interconnecting wiring thereon (not shown) of standard design to interconnect the several chips thereon as well as to extend to contacts (not shown) for communication external to the circuit 1. Silicon is preferred because it is readily available and because it can also be used to form electronic components thereon. The substrate 11 is disposed on a metal matrix composite plate 13 which will be described in more detail hereinbelow which acts to distribute the heat produced more evenly along the substrate 11 as well as to aid in the removal of heat from the device 1.

Figure 2:
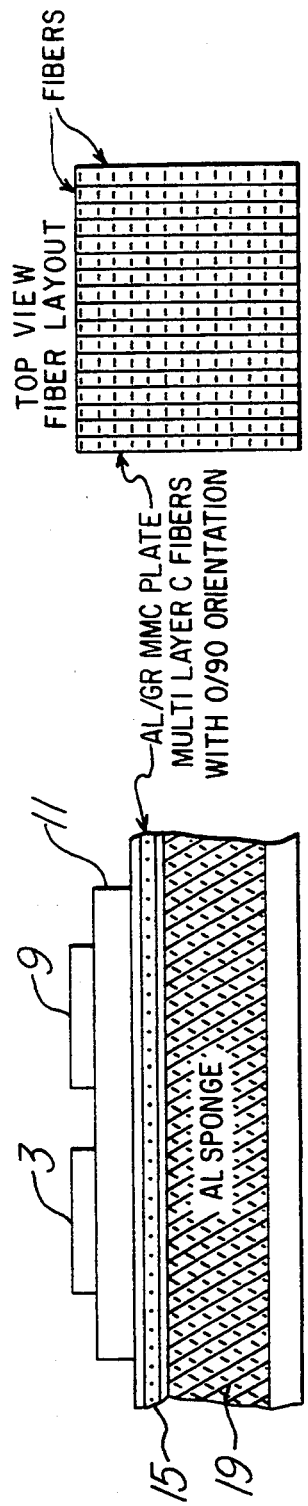
FIG. 2 is a cross-sectional side view of a portion of the embodiment of FIG. 1 the metal matrix in exploded view.

Referring to FIG. 2, there is shown a cross sectional view of a portion of the circuit of FIG. 1 which includes the metal matrix composite plate 13 on which is disposed the substrate 11 with chips 3 and 9 thereon. The plate 13 is a layer of heat conducting metal, preferably copper or aluminum, which has a matrix of carbon fibers 15 in a plurality of layers, each layer having a plurality of such fibers in rows, each layer being orthogonal to the layers above and below. The carbon fibers of adjacent rows preferably do not touch each other. It can be seen that heat from the chips 3 and 9 of FIG. 2 will be carried downward through the substrate 11 to the metal matrix 13. The heat will travel in the metal matrix to the carbon fibers 15 which have greater thermal conductivity than the metal of the matrix and cause the heat to travel away from their source in all directions including downward.

It is further now necessary to dissipate the heat travelling through the metal matrix 13 and away from the substrate 11. This is generally accomplished by use of air, water, fluorocarbon and other well known heat conductive materials which pass over one or more surfaces of the metal matrix 13 and a heat transfer device attached thereto.

Figure 3:
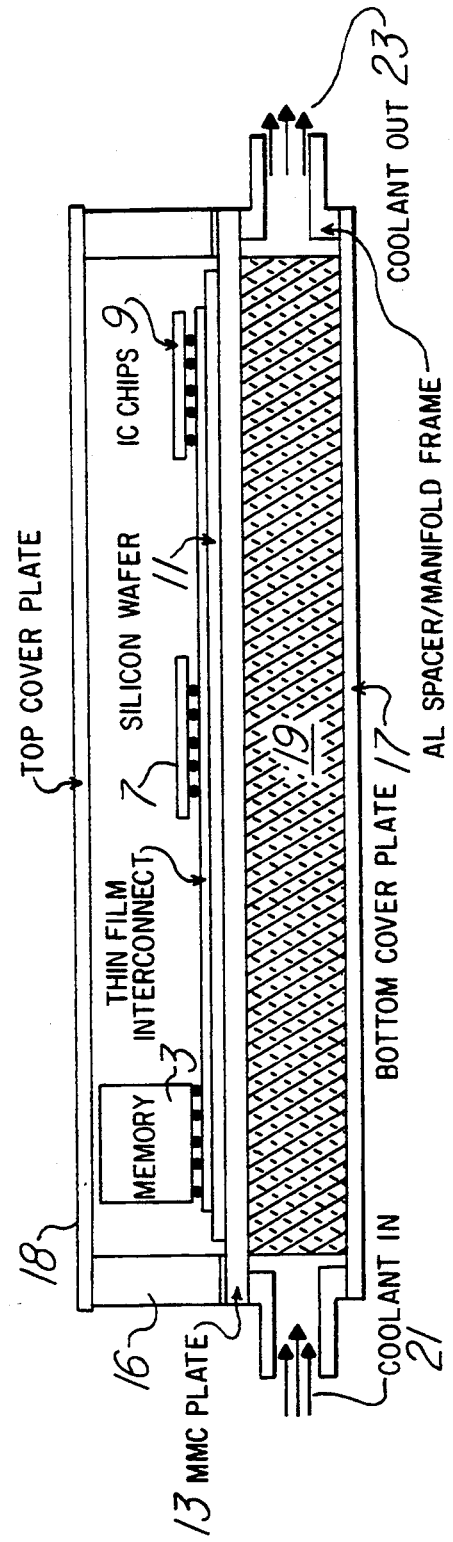
FIG. 3 is a cross-sectional view of the embodiment of FIG. 1 with a heat dissipating housing and sponge material therewithin.

More specifically, with reference to FIG. 3, there is shown the metal matrix 13 with substrate 11 thereon having chips 3 and 9 thereon. The metal matrix 13 rests on a housing 17 portion having an open top which is enclosed by the matrix 13 and which includes a sponge 19 therein. A further housing sidewall portion 16 is secured to the matrix 13 with a top cover plate 18 secured to the sidewall portion to forman enclosure therewith over the chips. The housing portions 16, 17 and 18 are formed from a material which matches the substrate 11 in coefficient of thermal expansion and has a high thermal conductivity in the plane of the structure so that it can dissipate heat laterally and rapidly. Composite materials made from metals and high thermal conductivity graphite fibers are preferred as the housing material, such as copper-molybdenum infiltrated metal matrix composites, aluminum-aluminum nitride metal matrix composites, copper-aluminum graphite and the like. Theoretically, any high thermal conductivity material can be used for the housing provided it matches the coefficient of thermal expansion of the substrate 11.

The sponge 19 is formed of a material preferably having high thermal conductivity and which is in the form of a wire mesh with open cell structure to providing interconnecting porosity. This structure is similar to "steel wool". A preferred structure would have about ten percent (10%) of the theoretical density of the sponge material itself. Such materials are known and available. The present preferred material is aluminum due to its high thermal conductivity and light weight. Copper is also a highly desirable material due to its high thermal conductivity. It is, however, much heavier than aluminum. The copper sponge is desirable where weight is not a factor. In this case, the sponge 19 will offer little resistance to fluid flow therethrough and will provide a large surface area for contact with fluid flowing through the sponge to provide a large heat transfer area for efficient heat transfer. For example, a surface area of 150 square inches per cubic inch of sponge is readily obtainable with the ten percent of theoretical density described above.

Figure 4:
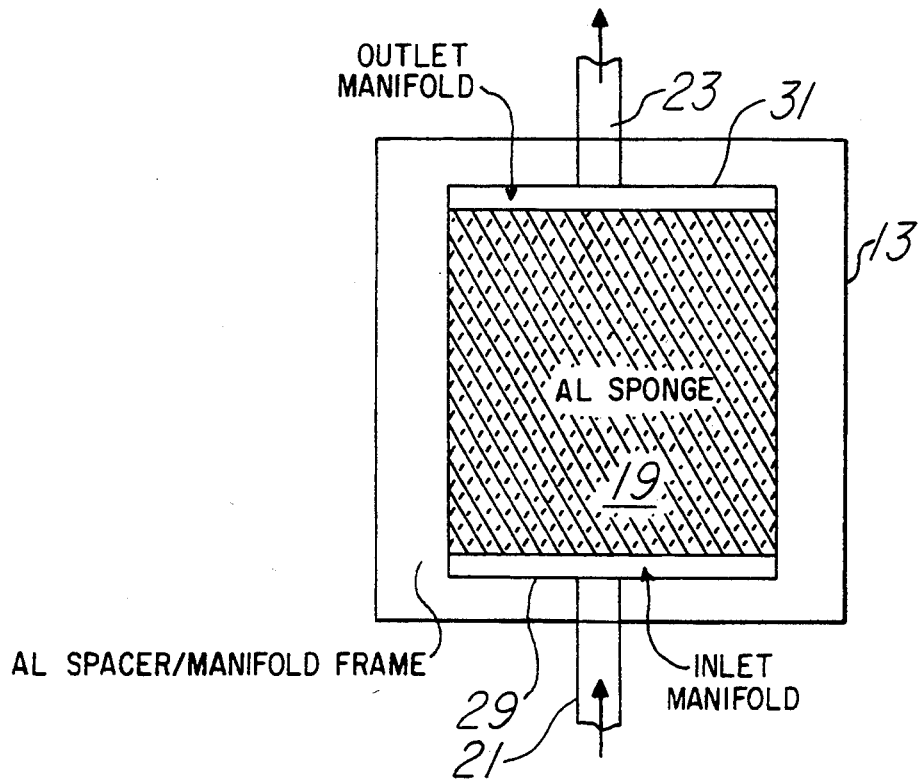
FIG. 4 is a horizontal cross-sectional view of a second embodiment of the housing of FIG. 3.

The housing 17 includes a fluid inlet 21 and a fluid outlet 23 for passage of the heat transfer fluid therethrough as shown in FIGS. 3 and 4. The sponge permits the transfer of heat with very small temperature drop from the sponge to the heat removing fluid. The sponge material 19 is preferably bonded to the housing 17 to avoid contraction thereof within the housing with concomitant decrease in the volume to area ratio desired.

FIG. 4 shows an additional feature wherein the sponge 19 is spaced from the wall 29 containing the inlet 21 and is spaced from the wall 31 containing the outlet 23. In this manner, fluid entering the housing from the inlet 21 will spread out sideways along the wall 29 before entering the sponge 19 and, after travel through the sponge, will travel inwardly along the wall 31 toward the outlet 23. In this way, the fluid flow through the sponge 19 will be substantially uniform throughout the sponge 19 to provide more uniform heat transfer along the entire area of the plate 13 which contacts the sponge.

Figure 5:
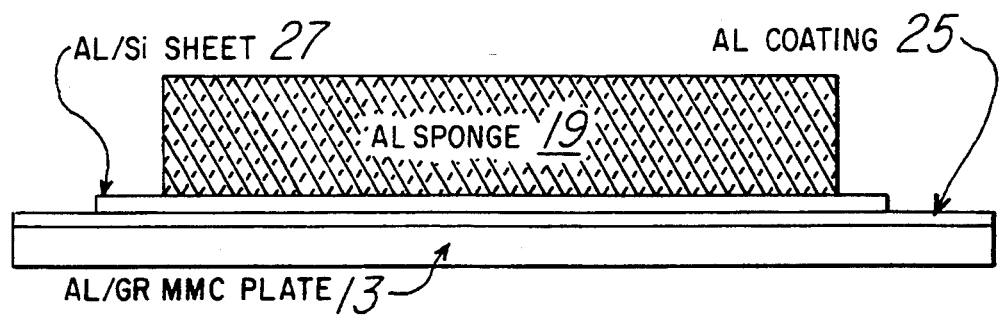
FIG. 5 is a side view of a further type of interconnection between the sponge-containing housing and the metal matrix.

A possible problem can arise in that the carbon fibers, for example, can provide some battery type action and result in corrosion. This problem is minimized as shown with reference to FIG. 5 by coating the plate 13 with aluminum 25 having a thickness of about 2 to 3 mils. The aluminum coating 25 is formed preferably by ion vapor deposition. This provides an aluminum coating of very high purity. A thin layer of aluminum/silicon sheet 27, which is an alloy, is disposed over the aluminum coating 25. The sponge 19 is disposed over the sheet 27 and is brazed thereto in standard manner. The aluminum/silicon alloy 27 is used as the brazing material or filler metal. This arrangement as well as the one described above provides all metal to metal interfaces to provide improved thermal conductivity as compared with the use of epoxy resins and the like for interconnection of materials.

It can be seen that there has been provided a heat sink structure for a semiconductor circuit which utilizes a metal fiber composite of novel design which spreads out point sources of heat to remove heat rapidly from components which produces large amounts of heat. There has also been provided a heat sink material in the form of a highly thermally conductive sponge type material having a high area to volume ratio and interconnecting porosity for rapidly dissipating heat. Still further, there has been provided a heat transfer system which initially spreads out or evens out the heat in an area having point sources of heat and then transfers this heat rapidly away from the heat producing source.

Though the invention has been described with respect to certain preferred embodiments thereof, many variations and modifications will immediately become apparent to those skilled in the art. It is therefore the intention that the appended claims be interpreted as broadly as possible in view of the prior art to include all such variations and modifications.

I claim:

1. A heat distributing device for uniformly distributing heat, comprising:
   (a) a substrate having localized heat producing elements thereon; and
   (b) a heat distributing device thermally coupled to said substrate, said heat distributing device including:
   (c) a highly thermally conductive metal; and
   (d) a plurality of highly thermally conductive fibers having higher thermal conductivity than said thermally conductive metal embedded in said metal, said fibers disposed in parallel spaced apart layers, adjacent ones of said layers extending in different directions.

2. The device of claim 1 wherein said substrate is composed of polycrystalline silicon.

3. The device of claim 2 wherein said metal is one of a group consisting of aluminum and copper.

4. The device of claim 3 wherein said fibers are carbon, the fibers in each of said layers being disposed in a direction substantially normal to the fibers in an adjacent layer.

5. The device of claim 4 wherein said fibers are spaced from each other along their entire length.

6. The device of claim 2 wherein said fibers are carbon, the fibers in each of said layers being disposed in a direction substantially normal to the fibers in an adjacent layer.

7. The device of claim 1 wherein said metal is one of a group consisting of aluminum and copper.

8. The device of claim 7 wherein said fibers are carbon, the fibers in each of said layers being disposed in a direction substantially normal to the fibers in an adjacent layer.

9. The device of claim 1 wherein said fibers are carbon, the fibers an each of said layers being disposed in a direction substantially normal to the fibers in an adjacent layer.

10. The device of claim 1 wherein said fibers are spaced from each other along their entire length.

* * * * *